US008785944B2

(12) United States Patent
Hwang et al.

(10) Patent No.: US 8,785,944 B2
(45) Date of Patent: Jul. 22, 2014

(54) HIGH ELECTRON MOBILITY TRANSISTOR

(71) Applicant: Samsung Electronics Co., Ltd., Suwon-Si (KR)

(72) Inventors: In-jun Hwang, Hwaseong-si (KR); Jae-joon Oh, Seongnam-si (KR); Jae-won Lee, Seoul (KR); Hyo-ji Choi, Seoul (KR); Jong-bong Ha, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/707,162

(22) Filed: Dec. 6, 2012

(65) Prior Publication Data

US 2013/0146890 A1 Jun. 13, 2013

(30) Foreign Application Priority Data

Dec. 7, 2011 (KR) .................. 10-2011-0130480
May 30, 2012 (KR) .................. 10-2012-0057472

(51) Int. Cl.
*H01L 29/778* (2006.01)
*H01L 29/20* (2006.01)
*H01L 29/423* (2006.01)
*H01L 29/43* (2006.01)

(52) U.S. Cl.
USPC .. 257/76; 257/195; 257/E29.246; 257/E29.14

(58) Field of Classification Search
None
See application file for complete search history.

(56) References Cited

U.S. PATENT DOCUMENTS

| 7,038,252 | B2 | 5/2006 | Saito et al. | |
| 7,728,356 | B2* | 6/2010 | Suh et al. | 257/194 |
| 8,120,072 | B2* | 2/2012 | Mouli | 257/280 |
| 2007/0205433 | A1* | 9/2007 | Parikh et al. | 257/192 |
| 2008/0296618 | A1* | 12/2008 | Suh et al. | 257/190 |
| 2012/0193637 | A1* | 8/2012 | Kalnitsky et al. | 257/76 |

FOREIGN PATENT DOCUMENTS

| JP | 2001-108712 A | 4/2001 |
| JP | 2009-141244 A | 6/2009 |
| KR | 2001-0094989 A | 11/2001 |
| KR | 2005-0022012 A | 3/2005 |

OTHER PUBLICATIONS

Mishra, U.K., et. al., "AlGaN/GaN HEMTs: An overview of device operation and applications", downloaded from URL<http://my.ece.ucsb.edu/Mishra/classfiles/overview.pdf> on Nov. 11, 2013.*
Huang, I.J., et. al., "Source Connected p-GaN gate HEMTS for Increased Threshold Voltage", IEEE Electron Device Letters, vol. 34, No. 5, May 2013, pp. 605-607.*
Y. Uemoto et al. "Gate Injection Transistor (GIT)-A Normally-Off AlGaN/GaN Power Transistor Using Conductivity Modulation", IEEE Transactions on Electron Devices, vol. 54, No. 12, p. 3393-3399, Dec. 2007.

* cited by examiner

*Primary Examiner* — Thomas L Dickey
*Assistant Examiner* — Joseph Schoenholtz
(74) *Attorney, Agent, or Firm* — Harness, Dickey & Pierce, P.L.C.

(57) ABSTRACT

A high electron mobility transistor (HEMT) according to example embodiments includes a first semiconductor layer, a second semiconductor layer on the first semiconductor layer, and a reverse diode gate structure on the second semiconductor layer. A source and a drain may be on at least one of the first semiconductor layer and the second semiconductor layer. A gate electrode may be on the reverse diode gate structure.

38 Claims, 7 Drawing Sheets

HIGH ELECTRON MOBILITY TRANSISTOR

CROSS-REFERENCE TO RELATED APPLICATIONS

This application claims priority under 35 U.S.C. §119 to Korean Patent Application Nos. 10-2011-0130480, filed on Dec. 7, 2011 and 10-2012-0057472, filed on May 30, 2012, in the Korean Intellectual Property Office, the disclosure of each of which is incorporated herein in its entirety by reference.

BACKGROUND

1. Field

The present disclosure relates to semiconductor devices, and more particularly, to high electron mobility transistors (HEMTs) having a reverse diode gate or a depletion structure.

2. Description of the Related Art

As communication technologies have continuously developed, electronic devices for high frequency bands have been actively studied. In particular, field effect semiconductor devices such as high electron mobility transistors (HEMTs) have drawn attention as power electronic devices to be used in high frequency bands.

A HEMT may include a heterostructure which is formed by adjoining semiconductor material layers having band gaps different from each other. Of the semiconductor material layers, a semiconductor material layer having a large band gap performs as a donor. Since the heterostructure includes the semiconductor material layers having band gaps different from each other, a 2-dimensional electron gas (2DEG) layer may be induced in the semiconductor material layer having a smaller band gap than the other, and thus, mobility of electrons may be increased.

The HEMT may be used for increasing the mobility of electron carriers and may be used as a high pressure-resistance transistor in a power electronic device as well. The HEMT includes a semiconductor having a wide band gap, for example, a compound semiconductor, and may have a relatively large high breakdown voltage. Therefore, the HEMT may be used in high voltage application fields.

In general, in semiconductor devices that include silicon, a high source resistance may be generated due to low electron mobility. Therefore, studies have been conducted to use a group III-V semiconductor compound in HEMTs. In particular, since GaN compounds have a relatively large band gap and a high electron saturation velocity, and are chemically stable, they have drawn attention as a material for HEMTs. Accordingly, studies have been actively performed to use GaN compounds in a high temperature, high output, and high frequency electronic device.

SUMMARY

Example embodiments relate to high electron mobility transistors (HEMTs) having a reverse diode gate structure or depletion structure.

Example embodiments relate to methods of manufacturing a HEMT having a reverse diode gate structure or depletion structure.

Additional aspects will be apparent from the description which follows and/or may be learned by practice of example embodiments.

According to example embodiments, a high electron mobility transistor includes a substrate, a first semiconductor layer on the substrate, a second semiconductor layer on the first semiconductor layer, a source and a drain on at least one of the first semiconductor layer and the second semiconductor layer, and a gate structure between the source and the drain. The gate structure includes a reverse diode gate structure and a gate electrode. The gate electrode may be on the reverse diode gate structure.

In example embodiments, the reverse diode gate structure may include a first layer including a p-type group III nitride semiconductor.

In example embodiments, the first layer may be doped with a p-type dopant, and the first layer may include at least one of GaN, InGaN, AlGaN, AlInN, and AlGaInN.

In example embodiments, the high electron mobility transistor may further include a second layer on the first layer. The second layer may be one of group III nitride semiconductor doped with an-n-type dopant, an undoped group III nitride semiconductor, and a group III nitride semiconductor doped with a p-type dopant at a concentration lower than a p-type dopant concentration in the first layer.

In example embodiments, the second layer may include at least one of GaN, InGaN, AlGaN, AlInN, and AlGaInN. The second layer may be doped with an n-type dopant and include at least one of GaN, InGaN, AlGaN, AlInN, and AlGaInN. The second layer may be include at least one of GaN, InGaN, AlGaN, AlInN, and AlGaInN, and the second layer may be doped with a p-type dopant at a concentration lower than a type dopant concentration in the first layer.

In example embodiments, the first layer may directly contact the source.

In example embodiments, the gate electrode may have a Schottky gate structure.

In example embodiments, the gate electrode may include at least one of W, Hf, and Al.

In example embodiments, the high electron mobility transistor may further include an intermediate layer between the second semiconductor layer and the reverse diode gate structure. The intermediate layer may include a group III nitride semiconductor.

In example embodiments, the first semiconductor layer and the second semiconductor layer may include semiconductor materials having different band gap energies from each other.

In example embodiments, a material of the second layer may have a larger band gap energy than a band gap energy of a material in the first layer.

In example embodiments, the first semiconductor layer may include a material that has a different lattice constant than a lattice constant of a material in the second semiconductor layer. One of the first semiconductor layer and the second semiconductor layer may include a 2-dimensional electron gas (2DEG) region at an interface between the first semiconductor layer and the second semiconductor layer.

In example embodiments, an upper surface of the second semiconductor layer may define a recess, and the gate structure may be on the recess defined by the upper surface of the second semiconductor layer.

In example embodiments, the gate electrode may be on the reverse diode gate structure.

According to example embodiments, a high electron mobility transistor includes a substrate, a first semiconductor layer on the substrate, a second semiconductor layer on the first semiconductor layer a source and a drain formed on at least one of the first semiconductor layer and the second semiconductor layer; and a gate structure between the source and the drain. The gate structure includes a depletion layer and a gate electrode connected to the source.

In example embodiments, the depletion layer may be formed of a nitride semiconductor. The nitride semiconductor may include at least one GaN, InGaN, AlGaN, AlInN, and AlGaInN.

In example embodiments, the depletion layer may be p-type doped.

In example embodiments, the gate structure may be arranged so an insulating layer is not between the depletion layer and the gate electrode.

In example embodiments, the gate electrode may be directly on the depletion layer.

In example embodiments, a bridge may be on the second semiconductor layer, and the bridge may connect a sidewall of the source to a sidewall of the depletion layer.

In example embodiments, the depletion layer may be spaced apart from the drain.

According to example embodiments a high electron mobility transistor may include a first semiconductor layer, a second semiconductor layer on the first semiconductor layer, and first to third electrodes spaced apart on at least one of the first semiconductor layer and the second semiconductor layer. The second electrode is on one of a depletion structure and a reverse diode structure. If the second electrode is on the depletion structure, then the high electron mobility transistor may be arranged so an insulating layer is not between opposing surfaces of the second electrode and the depletion structure, and the depletion structure may be spaced apart from the third electrode.

In example embodiments, the second semiconductor layer may be configured to induce a two-dimensional electron gas (2DEG) in the first semiconductor layer.

In example embodiments, the one of the depletion structure and the reverse diode structure may be the depletion structure, and the depletion structure may include a p-type depletion layer between the second electrode and the second semiconductor layer. The p-type depletion layer may include at least one of GaN, InGaN, AlInN, and AlGaInN. The depletion structure may further include a bridge between a sidewall of the p-type depletion layer and a sidewall of the first electrode. A metal layer may be connected to the sidewall of the first electrode and the bridge, wherein the metal layer may include a metal having a low work function.

In example embodiments, the one of the depletion structure and the reverse diode structure may be the reverse diode structure. The reverse diode structure may include a first layer including a group III nitride semiconductor doped with a p-type dopant, and a second layer on the first layer. The second layer may include one of a group III nitride semiconductor doped with an n-type dopant, an undoped group III nitride semiconductor, and a group III nitride semiconductor doped with a p-type dopant at a lower concentration than a p-type dopant concentration in the first layer.

In example embodiments, the second layer of the reverse diode structure may include at least one of GaN, InGaN, AlGaN, AlInN, and AlGaInN.

In example embodiments, the second layer of the reverse diode structure may include at least one of GaN, InGaN, AlGaN, AlInN, and AlGaInN, and the second layer may be doped with an n-type dopant.

In example embodiments, the second layer of the reverse diode structure may include at least one of GaN, InGaN, AlGaN, AlInN, and AlGaInN, and the second layer may be doped with an p-type dopant at a lower concentration than a concentration of p-type dopant in the first layer.

In example embodiments, the first layer of the reverse diode structure may directly contact the first electrode.

In example embodiments, the gate electrode may have Schottky gate structure.

In example embodiments, an intermediate layer may be on the second semiconductor layer, the intermediate layer may include an undoped group III nitride semiconductor, the high electron mobility transistor may include the reverse diode structure, and the reverse diode structure may be on the intermediate layer.

In example embodiments, the first semiconductor layer and the second semiconductor layer may include semiconductor materials having at least one of different band gap energies from each other, different lattice constants from each other, and different polarizations from each other.

In example embodiments, an upper surface of the second semiconductor layer may define a recess.

In example embodiments, the second electrode may be on the recess defined by the upper surface of the second semiconductor layer.

In example embodiments, the first electrode may be a source electrode, the second electrode may be a gate electrode on the second semiconductor layer, the third electrode may be a drain electrode, and the source and drain electrode may be on at least one of the first semiconductor layer and the second semiconductor layer.

BRIEF DESCRIPTION OF THE DRAWINGS

These and/or other aspects will become apparent and more readily appreciated from the following description of non-limiting embodiments, taken in conjunction with the accompanying drawings, in which like reference characters refer to the same parts throughout the different views. The drawings are not necessarily to scale, emphasis instead being placed upon illustrating the principles of inventive concepts. In the drawings.

DETAILED DESCRIPTION

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1A:
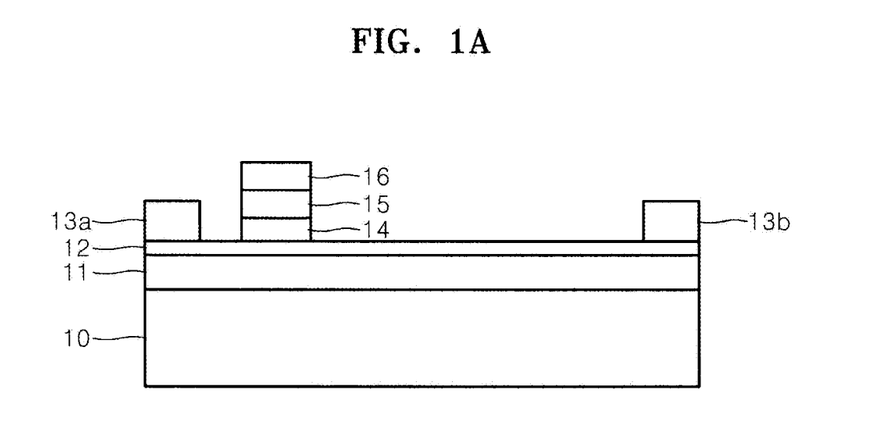
FIGS. 1A, 1B, and 1C are cross-sectional views of high electron mobility transistors (HEMTs) according to example embodiments.
Figure 1B:
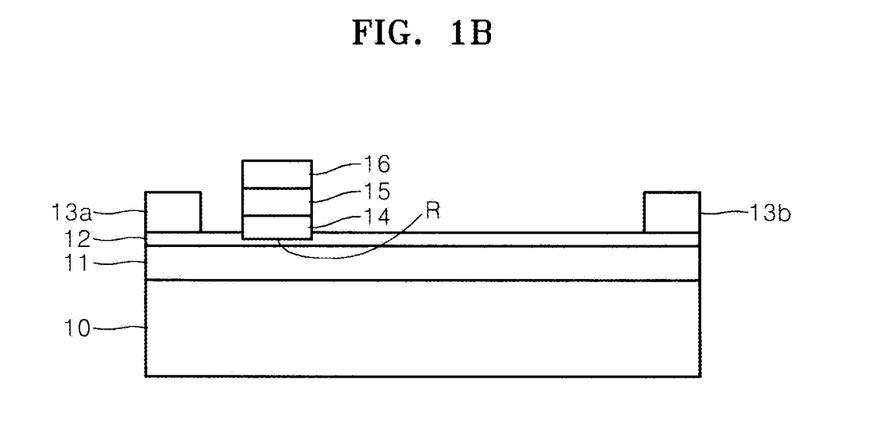
Figure 1C:
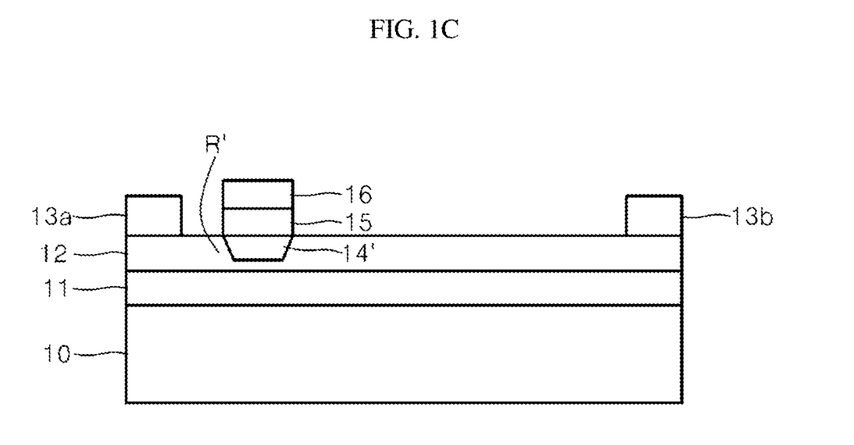

FIGS. 1A, 1B, and 1C are cross-sectional views of high electron mobility transistors (HEMTs) according to example embodiments.

Referring to FIG. 1A, a high electron mobility transistor according to example embodiments may include a substrate 10, a first semiconductor layer 11 formed on the substrate 10, and a second semiconductor layer 12 formed on the first semiconductor layer 11. A source 13a and a drain 13b may be formed on the second semiconductor layer 12, and a gate structure may be formed between the source 13a and the drain 13b on the second semiconductor layer 12. The gate structure may include a depletion structure on the second semiconductor layer 12, wherein the gate structure of FIG. 1A may include a reverse diode gate structure that is a depletion structure, and a gate electrode 16.

Since the reverse diode gate structure is formed between the gate electrode 16 and the second semiconductor layer 12, the injection of holes from the gate electrode 16 to the second semiconductor layer 12 is limited (and/or prevented), and thus, electrons may cross-over a barrier from a channel of the first semiconductor layer 11. The reverse diode gate structure may include a first layer 14 and a second layer 15.

Optionally, a buffer layer (not shown) may further be formed between the substrate 10 and the first semiconductor layer 11 using, for example, AlN or AlGaN.

Optionally, a recess R may further be formed on a region of an upper surface of the second semiconductor layer 12 as shown in FIG. 1B. In other words, the upper surface of the second semiconductor layer 12 may define the recess region R. The thickness of the region of the second semiconductor layer 12 where the recess R is formed may be thinner than regions where the recess R is not formed. If the recess R is formed on a region of the second semiconductor layer 12, the gate structure may be formed on the region of the second semiconductor layer 12 where the recess R is formed.

Optionally, as shown in FIG. 1C, a recess region R' having tapered sidewalls may be formed in an upper surface of the second semiconductor layer 12', and the first layer 14' may be formed to have a shape that conforms to the sidewalls of the recess region R'. In other words, the upper surface of the second semiconductor layer 12' may define the recess region R'. Otherwise, the HEMT in FIG. 1C is the same as the HEMT in FIGS. 1A and 1B.

Optionally, the source 13a and the drain 13b may be formed on the first semiconductor layer 11 to directly contact the first semiconductor layer 11.

Materials that constitute each of the layers of an HEMT according to example embodiments are as follows. For reference, components having the same names herein may be formed of the same materials.

The substrate 10 may be formed of, for example, a semiconductor such as silicon doped with a desired (and/or alternatively predetermined) dopant, silicon carbide (SiC), $Al_2O_3$, or direct-bonded copper (DBC). However, example embodiments are not limited thereto. The substrate 10 may also be connected to a ground.

The first and second semiconductor layers 11 and 12 may be respectively formed of second semiconductor materials having band gap energies different from each other. The second semiconductor layer 12 may be formed of a semiconductor material having a band gap and polarizability greater than those of a semiconductor material used to form the first semiconductor layer 11. The first and second semiconductor layers 11 and 12 may be chemical compound semiconductor layers having lattice constants different from each other. A 2-dimensional electron gas (2DEG) region may be generated on an interface between the first and second semiconductor layers 11 and 12 due to heterostructures of the first and second semiconductor layers 11 and 12. The first semiconductor layer 11 may be a channel region, and the second semiconductor layer 12 may be a channel supply layer. The materials and features of second semiconductor layer 12' illustrated in FIG. 1C may be the same as those of the second semiconductor layer 12 in FIGS. 1A to 1B, except for having the recessed region R'.

The first semiconductor layer 11 may include a group III-V semiconductor compound, for example, a material selected from the group consisting of GaN, GaAs, InN, InGaN, and AlGaN.

The second semiconductor layer 12 may be formed of a material a group III-V semiconductor compound, such as AlN, AlGaN, AlInN, AlGaInN, and AlGaAs. The second semiconductor layer 12 may be undoped. Alternatively, the second semiconductor layer may be doped with an n-type dopant. The n-type dopant may be silicon, but example embodiments are not limited thereto. Also, the second semiconductor layer 12 may have a multi-layer structure formed of a plurality of layers in which the content of Al and In in the materials described above are different from each other.

The source 13a and the drain 13b may be formed of a conductive material, for example, a material selected from the group consisting of a metal, a metal alloy, a conductive metal oxide, and a conductive metal nitride. The source 13a and the drain 13b may have a single layer structure or a multi-layer structure. The source 13a and the drain 13b may be formed on the second semiconductor layer 12, but alternatively, may be formed directly on the first semiconductor layer 11.

The gate electrode 16 may be formed of a conductive material, for example, a material selected from the group consisting of a metal, a metal alloy, a conductive metal oxide, and a conductive metal nitride. For example, the gate electrode 16 may be formed of a metal having a low work function below or equal to 4.5, for example, Hf, W, or Al, and may form a Schottky gate structure by directly forming the gate electrode 16 on the second layer 15. Also, the gate electrode 16 may be formed of a transition metal nitride, for example, TiN, TaN, or WN. Furthermore, the gate electrode 16 may be formed of a semiconductor material doped with an n-type dopant, for example, an n-type Si or an n-type Ge.

The first layer 14 of the reverse diode gate structure may be formed of a p-type group III nitride semiconductor, and the second layer 15 may an n-type group III nitride semiconductor layer, an undoped group III nitride semiconductor layer, or a group III nitride semiconductor layer doped with a p-type dopant at a lower concentration than that of the p-type dopant in the first layer 14.

More specifically, the first layer 14 may be formed of at least one material selected from the group consisting of GaN, InGaN, AlGaN, AlInN, and AlGaInN, which is doped with a p-type dopant (e.g., Mg). The second layer 15 may be formed of at least one material selected from the group consisting of GaN, InGaN, AlGaN, AlInN, and AlGaInN. Also, the second layer 15 may be formed of at least one material selected from the group consisting of GaN, InGaN, AlGaN, AlInN, and AlGaInN, which is doped with an n-type dopant (e.g., Si), or at least one material selected from the group consisting of GaN, InGaN, AlGaN, AlInN, and AlGaInN, which is doped with a p-type dopant (e.g., Mg). When the second layer 15 is an insulating layer, holes are injected in the gate electrode 16 and a channel may be formed in the first layer 14.

The materials and features of the first layer 14' illustrated in FIG. 1C may be the same as those of the first layer 14 illustrated in FIGS. 1A and 1B, except for the first layers 14 and 14' having different shapes.

In an HEMT according to example embodiments, a reverse diode gate structure may be formed on the second semiconductor layer 12, and thus, hole injection from the gate electrode 16 into the second semiconductor layer 12 may be limited (and/or prevented). Accordingly, in an HEMT according to example embodiments, a gate leakage may be reduced and a threshold voltage (Vth) may be increased.

Figure 2:
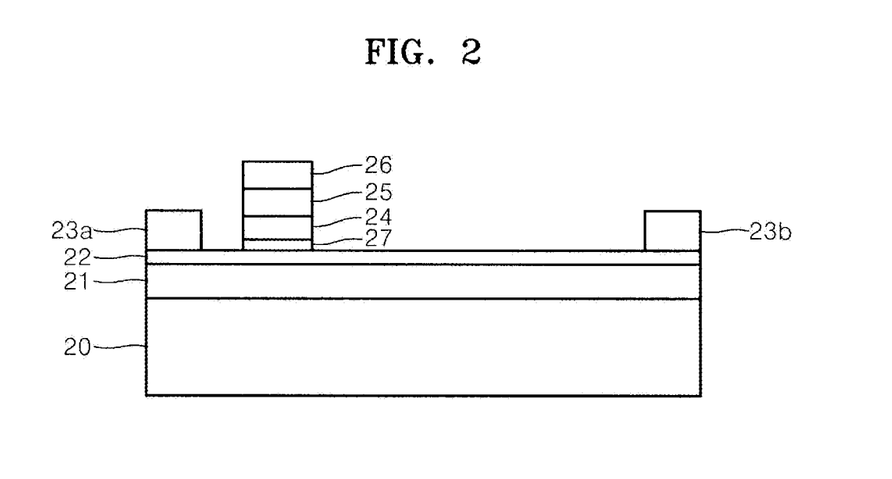
FIG. 2 is a cross-sectional view of an HEMT according to example embodiments.
Figure 3:
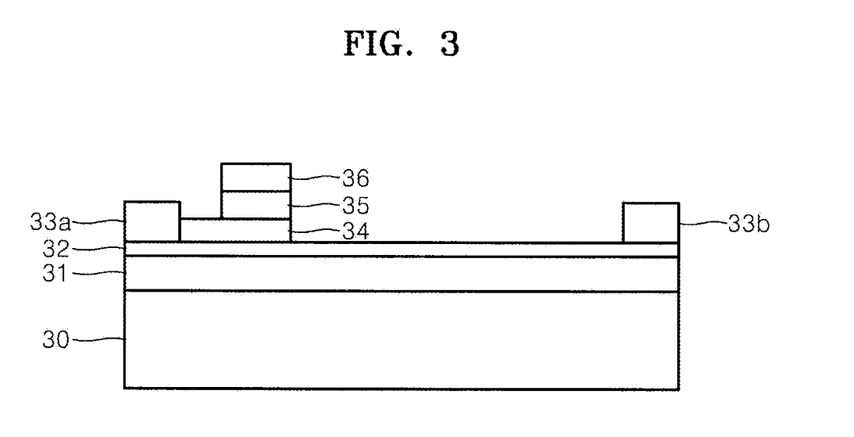
FIG. 3 is a cross-sectional view of an HEMT according to example embodiments.
Figure 4:
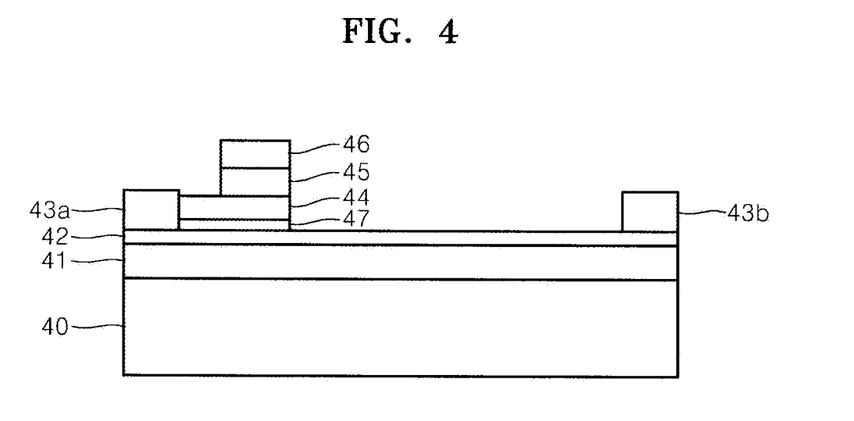
FIG. 4 is a cross-sectional view of an HEMT according to example embodiments.

FIGS. 2 through 4 are cross-sectional views showing HEMTs according to example embodiments.

Referring to FIG. 2, an HEMT according to example embodiments may include a substrate 20, a first semiconductor layer 21 formed on the substrate 20, and a second semiconductor layer 22 formed on the first semiconductor layer 21. A source 23a and a drain 23b may be formed on the second semiconductor layer 22, and a reverse diode gate structure that includes a first layer 24 and a second layer 25 and a gate electrode 26 may be formed between the source 23a and the drain 23b on the second semiconductor layer 22. The first layer 24 may be formed of a p-type group III nitride semiconductor. An intermediate layer 27 may be formed between the second semiconductor layer 22 and the reverse diode gate structure.

The intermediate layer 27 may limit (and/or prevent) the diffusion of a p-type dopant from the first layer 24 of the reverse diode gate structure to the second semiconductor layer 22. The intermediate layer 27 may be formed of an undoped group III nitride semiconductor. For reference, each of the layers shown in FIG. 2 may be formed of the materials used to form the layers that are indicated as the same names shown in FIGS. 1A and 1B. In other words, the substrate 20, first semiconductor layer 21, second semiconductor layer 22, source 23a, drain 23b, first layer 24, second layer 25, and gate electrode 26 in FIG. 2 may be formed of the same materials as the substrate 10, first semiconductor layer 11, second semiconductor layer 12, source 13a, drain 13b, first layer 14, second layer 15, and gate electrode 16 respectively.

Referring to FIG. 3, the HEMT may include a substrate 30, a first semiconductor layer 31 formed on the substrate 30, and a second semiconductor layer 32 formed on the first semiconductor layer 31. A source 33a and a drain 33b may be formed on the second semiconductor layer 32, and a reverse diode gate structure that includes a first layer 34 and a second layer 35 and a gate electrode 36 may be formed between the source 33a and the drain 33b on the second semiconductor layer 32.

The first layer 34 may be formed of a p-type group III nitride semiconductor, and a bridge may be formed to contact with a lateral of the source 33a. Since the first layer 34 is formed to directly contact the source 33a, holes that may be accumulated in the first layer 34 may be depleted through the source 33a. For reference, each of the layers shown in FIG. 3 may be formed of the materials used to form the layers that are indicated as the same names shown in FIGS. 1A and 1B. In other words, the substrate 30, first semiconductor layer 31, second semiconductor layer 32, source 33a, drain 33b, first layer 34, second layer 35, and gate electrode 36 in FIG. 3 may be formed of the same materials as the substrate 10, first semiconductor layer 11, second semiconductor layer 12, source 13a, drain 13b, first layer 14, second layer 15, and gate electrode 16 respectively.

Referring to FIG. 4, the HEMT may include a substrate 40, a first semiconductor layer 41 formed on the substrate 40, and a second semiconductor layer 42 formed on the first semiconductor layer 41. A source 43a and a drain 43b may be formed on the second semiconductor layer 42, and a reverse diode gate structure that includes a first layer 44 and a second layer 45 and a gate electrode 46 may be formed between the source 43a and the drain 43b on the second semiconductor layer 42. An intermediate layer 47 may be formed between the second semiconductor layer 42 and the first layer 44 of the reverse diode gate structure to limit (and/or prevent) diffusion of a p-type dopant into the first layer 44 from the second semiconductor layer 42.

The intermediate layer 47 may be formed of an undoped group III nitride semiconductor. The first layer 44 of the reverse diode gate structure may include a bridge to directly contact the source 43a so that holes that may be accumulated in the first layer 44 may be depleted through the source 43a. Each of the layers shown in FIG. 4 may be formed of the same materials as the layers shown in FIGS. 1A and 1B. In other words, the substrate 40, first semiconductor layer 41, second semiconductor layer 42, source 43a, drain 43b, first layer 44, second layer 45, and gate electrode 46 in FIG. 4 may be formed of the same materials as the substrate 10, first semiconductor layer 11, second semiconductor layer 12, source 13a, drain 13b, first layer 14, second layer 15, and gate electrode 16 respectively.

A method of manufacturing an HEMT according to example embodiments will now be described with reference to accompanying drawings.

FIGS. 5A through 5D are cross-sectional views showing a method of manufacturing an HEMT according to example embodiments.

Figure 5A:
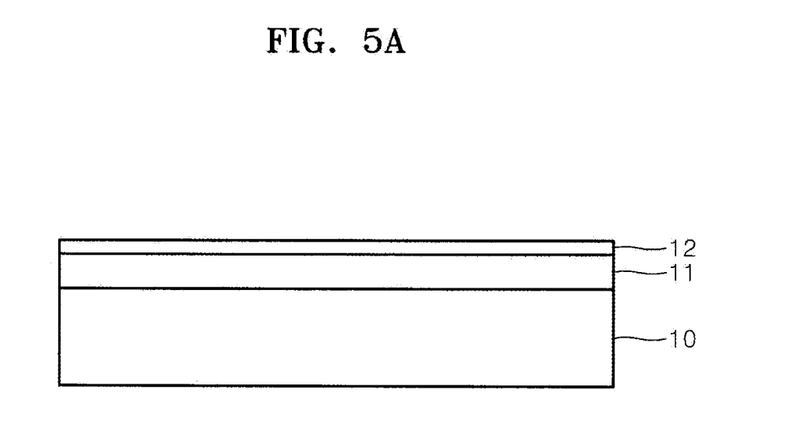
FIGS. 5A through 5D are cross-sectional views showing a method of manufacturing an HEMT according to example embodiments.

Referring to FIG. 5A, first and second semiconductor layers 11 and 12 are sequentially formed on a substrate 10. The substrate 10 may be formed of silicon doped with a desired (and/or alternatively predetermined) dopant.

Figure 5B:
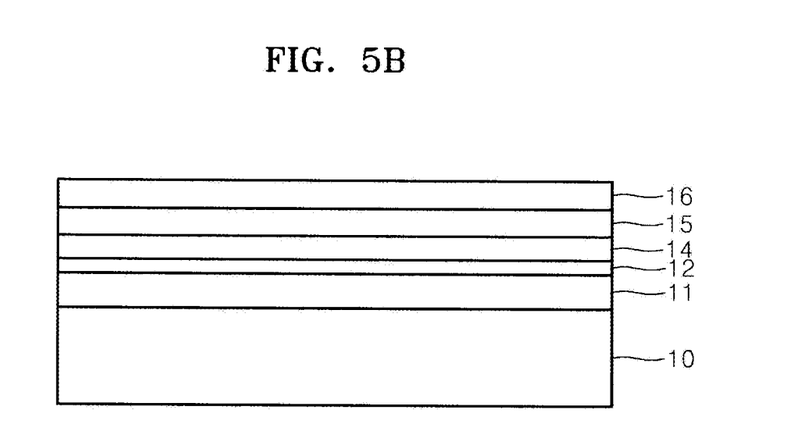
Figure 5C:
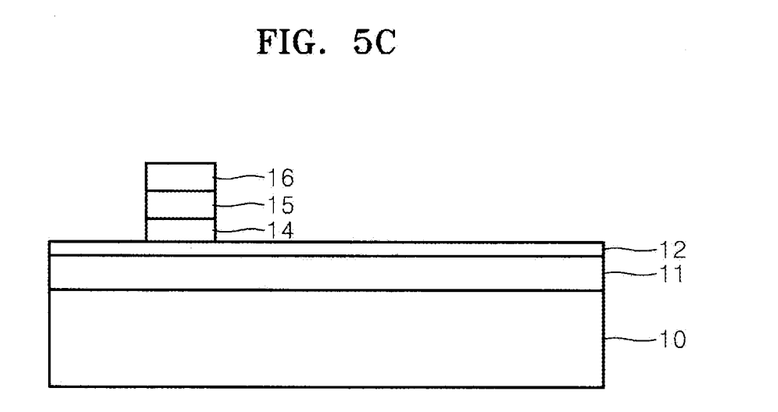

Referring to FIG. 5B, in order to form a gate structure on the first and second semiconductor layers 11 and 12, material layers corresponding to each of the first and second semiconductor layers 11 and 12 are formed. The gate structure includes a reverse diode gate structure and a gate electrode 16, and the materials used to form each of the layers are described above with reference to FIGS. 1A and 1B. For reference, optionally, a recess may be formed on a region of an upper surface of the second semiconductor layer 12 before the gate structure is formed. As depicted in FIG. 5C, an etching process may be performed for the gate structure to have a desired (and/or alternatively predetermined) width.

Figure 5D:
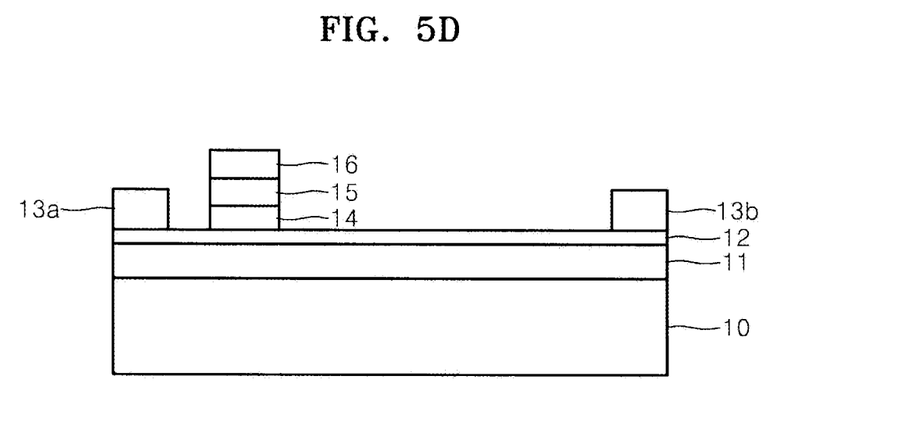

Referring to FIG. 5D, a conductive material is coated on the second semiconductor layer 12 on both sides of the gate structure. Afterwards, the conductive material is patterned to form a source 13a and a drain 13b. The source 13a and the drain 13b may be formed on the second semiconductor layer 12, but alternatively, for a contact, the second semiconductor layer 12 may be partially removed at locations where the source 13a and 13b are to be formed to expose the first semiconductor layer 11, and then the source 13a and the 13b may be formed on the exposed surfaces.

Figure 6A:
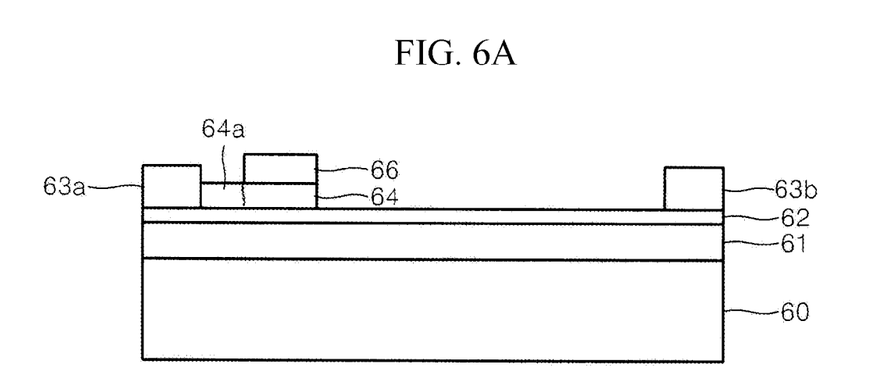
FIGS. 6A and 6B are a cross-sectional view and a perspective view of an HEMT according to example embodiments.
Figure 6B:
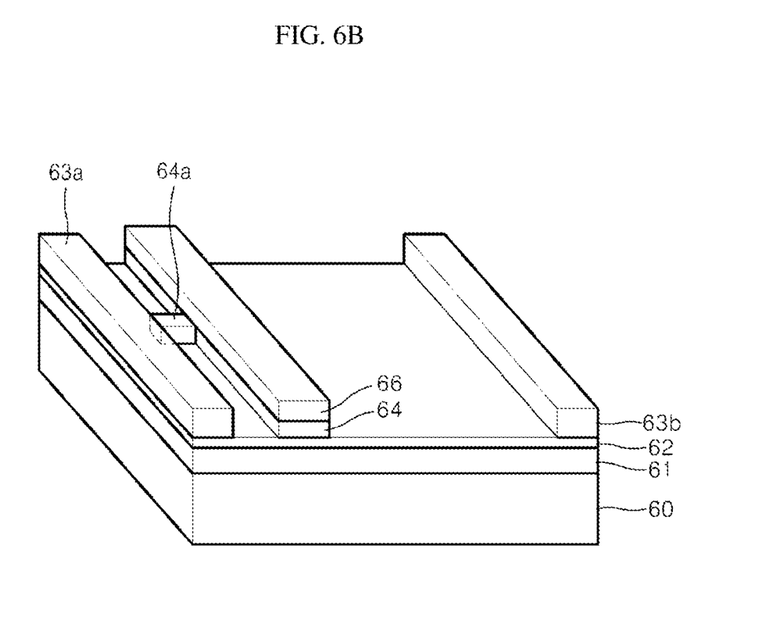

FIGS. 6A and 6B are a cross-sectional view and a perspective view of an HEMT according to example embodiments.

Referring to FIGS. 6A and 6B, the HEMT may include a substrate 60, a first semiconductor layer 61 formed on the substrate 60, and a second semiconductor layer 62 formed on the first semiconductor layer 61. A source 63a and a drain 63b may be formed on the second semiconductor layer 62, and a gate structure may be formed on the second semiconductor layer 62 between the source 63a and the drain 63b. The gate structure may include a depletion layer 64 and a gate electrode 66. The gate structure may be arranged so an insulating layer (e.g., a coated oxide or nitride film) is not between the gate electrode 66 and the depletion layer 64. For example, the gate electrode 66 may be directly on the depletion layer 64. For example, the gate electrode 66 and depletion layer 64 may be arranged so an insulating layer is not between at least one surface of the gate electrode 66 that faces at least one surface of the depletion layer 64.

In FIGS. 6A and 6B, the depletion layer 64 may be included as part of a depletion structure between the second semiconductor layer 62 and the gate electrode 66, and the depletion layer 64 and the source 63a may be connected to each other via a bridge 64a (and/or a plurality of bridges 64a). The depletion layer 64 may be formed to deplete a channel formed between the first and second semiconductor layers 61 and 62. A breakdown voltage of the HEMT may be reduced in a structure including the depletion layer 64, but by directly connecting the depletion layer 64 and the source 63a via the bridge 64a, the breakdown voltage may be limited (and/or prevented) from being reduced. The depletion layer 64 may be formed of a p-type nitride semiconductor, for example, p-type doped nitride semiconductor. Here, examples of a nitride semiconductor include GaN, InGaN, AlGaN, AlInN, and AlGaInN. The bridge 64a may be formed of the same material as the depletion layer 64 and may be contiguous with the depletion layer 64.

Optionally, a metal may be formed between the bridge 64a (e.g., p-type GaN) and the source 63a. The metal having a low work function between the bridge 64a and the source 63a may have a work function that is lower than or equal to 4.5.

Although FIGS. 6A and 6B illustrate the source 63a and the drain 63b on the second semiconductor layer, example embodiments are not limited thereto. Optionally, the source 63a and the drain 63b may be formed directly on the first semiconductor layer 61 to directly contact the first semiconductor layer 61, and the bridge 64a may be connected to a portion of the source 63a that extends above the second semiconductor layer 62.

Each of the layers shown in FIGS. 6A and 6B may be formed of the same materials as the layers shown in FIGS. 1A and 1B having the same name. In other words, the substrate 60, first semiconductor layer 61, second semiconductor layer 62, source 63a, drain 63b, first and gate electrode 66 in FIGS. 6A and 6B may be formed of the same materials as the substrate 10, first semiconductor layer 11, second semiconductor layer 12, source 13a, drain 13b, and gate electrode 16 respectively.

While some example embodiments have been particularly shown and described, it will be understood by one of ordinary skill in the art that variations in form and detail may be made therein without departing from the spirit and scope of the claims. Descriptions of features or aspects within each HEMT according to embodiments should typically be considered as available for other similar features or aspects in other HEMTs according to embodiments.

What is claimed is:
1. A high electron mobility transistor comprising:
a substrate;
a first semiconductor layer on the substrate;
a second semiconductor layer on the first semiconductor layer;
a source and a drain on at least one of the first semiconductor layer and the second semiconductor layer; and
a gate structure between the source and the drain,
the gate structure including a reverse diode gate structure and a gate electrode,
wherein the reverse diode gate structure includes a first layer, and a second layer on the first layer, and the second layer is doped with a p-type dopant at a concentration lower than a concentration of p-type dopant in the first layer.

2. The high electron mobility transistor of claim 1, wherein the first layer includes a p-type group III nitride semiconductor.

3. The high electron mobility transistor of claim 2, wherein the first layer includes at least one of GaN, InGaN, AlGaN, AlInN, and AlGaInN.

4. The high electron mobility transistor of claim 1, wherein the second layer includes at least one of GaN, InGaN, AlGaN, AlInN, and AlGaInN.

5. The high electron mobility transistor of claim 1, wherein the gate electrode has a Schottky gate structure.

6. The high electron mobility transistor of claim 1, further comprising:
an intermediate layer between the second semiconductor layer and the reverse diode gate structure.

7. The high electron mobility transistor of claim 6, wherein the intermediate layer includes a group III nitride semiconductor.

8. The high electron mobility transistor of claim 7, wherein a material of the second semiconductor layer has a larger band gap energy than a band gap energy of a material in the first semiconductor layer.

9. The high electron mobility transistor of claim 1, wherein the first semiconductor layer and the second semiconductor layer include semiconductor materials having different band gap energies from each other.

10. The high electron mobility transistor of claim 1, wherein
the first semiconductor layer includes a material that has a different lattice constant than a lattice constant of a material in the second semiconductor layer, and
one of the first semiconductor layer and the second semiconductor layer includes a 2-dimensional electron gas (2DEG) region at an interface between the first semiconductor layer and the second semiconductor layer.

11. The high electron mobility transistor of claim 1, wherein the gate electrode is on the reverse diode gate structure.

12. A high electron mobility transistor comprising:
a substrate;
a first semiconductor layer on the substrate;
a second semiconductor layer on the first semiconductor layer;
a source and a drain on at least one of the first semiconductor layer and the second semiconductor layer; and
a gate structure between the source and the drain,
the gate structure including a reverse diode gate structure and a gate electrode,
wherein an upper surface of the second semiconductor layer defines a recess.

13. The high electron mobility transistor of claim 12, wherein the gate structure is on the recess defined by the upper surface of the second semiconductor layer.

14. A high electron mobility transistor comprising:
a substrate;
a first semiconductor layer on the substrate;
a second semiconductor layer on the first semiconductor layer;
a source and a drain on at least one of the first semiconductor layer and the second semiconductor layer; and
a gate structure between the source and the drain,
the gate structure including a reverse diode gate structure and a gate electrode,
wherein the reverse diode gate structure includes a first layer and a second layer on the first layer,
the first layer includes a p-type group III nitride semiconductor,
wherein the second layer includes:
an undoped group III nitride semiconductor.

15. The high electron mobility transistor of claim 14, wherein the second layer includes at least one of GaN, InGaN, AlGaN, AlInN, and AlGaInN.

16. A high electron mobility transistor comprising:
a substrate;
a first semiconductor layer on the substrate;
a second semiconductor layer on the first semiconductor layer;
a source and a drain on at least one of the first semiconductor layer and the second semiconductor layer; and
a gate structure between the source and the drain,
the gate structure including a reverse diode gate structure and a gate electrode,
wherein the reverse diode gate structure includes a first layer, and
wherein the first layer directly contacts the source.

17. A high electron mobility transistor comprising:
a substrate;
a first semiconductor layer on the substrate;
a second semiconductor layer on the first semiconductor layer;
a source and a drain on at least one of the first semiconductor layer and the second semiconductor layer; and
a gate structure between the source and the drain,
the gate structure including a reverse diode gate structure and a gate electrode,
wherein the reverse diode gate structure includes a first layer, and
wherein the gate electrode comprises a metal having a work function of less than or equal to 4.5 eV.

18. A high electron mobility transistor comprising:
a substrate;
a first semiconductor layer on the substrate;
a second semiconductor layer on the first semiconductor layer;
a source and a drain on at least one of the first semiconductor layer and the second semiconductor layer; and
a gate structure between the source and the drain,
the gate structure including a reverse diode gate structure and a gate electrode,
wherein the gate electrode includes at least one of W, Hf, and Al.

19. A high electron mobility transistor comprising:
a substrate;
a first semiconductor layer on the substrate;
a second semiconductor layer on the first semiconductor layer;
a source and a drain on at least one the first semiconductor layer and the second semiconductor layer; and
a gate structure between the source and the drain,
the gate structure includes a gate electrode and a depletion layer connected to the source.

20. The high electron mobility transistor of claim 19, wherein the depletion layer includes at least one nitride semiconductor.

21. The high electron mobility transistor of claim 20, wherein the nitride semiconductor includes at least one of GaN, InGaN, AlGaN, AlInN, and AlGaInN.

22. The high electron mobility transistor of claim 20, wherein the depletion layer is p-type doped.

23. The high electron mobility transistor of claim 19, wherein the gate structure does not include an insulating layer between the depletion layer and the gate electrode.

24. The high electron mobility transistor of claim 19, wherein the gate electrode is directly on the depletion layer.

25. The high electron mobility transistor of claim 19, further comprising:
a bridge on the second semiconductor layer,
wherein the bridge connects a sidewall of the source to a sidewall of the depletion layer.

26. The high electron mobility transistor of claim 19, wherein the depletion layer is spaced apart from the drain.

27. A high electron mobility transistor comprising:
a first semiconductor layer;
a second semiconductor layer on the first semiconductor layer;
a first electrode, a second electrode, and a third electrode spaced apart on at least one of the first semiconductor layer and the second semiconductor layer,
the second electrode being on a depletion structure and the depletion structure is spaced part from the third electrode,
wherein the depletion structure does not include a n-type semiconductor.

28. The high electron mobility transistor of claim 27, wherein the second semiconductor layer is configured to induce a two-dimensional electron gas (2DEG) in the first semiconductor layer.

29. The high electron mobility transistor of claim 27, wherein
the depletion structure includes a p-type depletion layer between the second electrode and the second semiconductor layer.

30. The high electron mobility transistor of claim 29, wherein the depletion structure further includes a bridge between a sidewall of the p-type depletion layer and a sidewall of the first electrode.

31. The high electron mobility transistor of claim 30, further comprising:
a metal layer connected to the sidewall of the first electrode and the bridge,
wherein the metal layer includes a metal having a low work function.

32. The high electron mobility transistor claim 27, wherein the gate electrode has a Schottky gate structure.

33. The high electron mobility transistor of claim 27, further comprising:
an intermediate layer on the second semiconductor layer, wherein
the intermediate layer includes an undoped group III nitride semiconductor,
the depletion structure is a reverse diode structure, and
the reverse diode structure is on the intermediate layer.

34. The high electron mobility transistor of claim 27, wherein
the first semiconductor layer and the second semiconductor layer include semiconductor materials having at least one of different band gap energies from each other, different lattice constants from each other, and different polarizations from each other.

35. The high electron mobility transistor of claim 27, wherein
the first electrode is a source electrode,
the second electrode is a gate electrode on the second semiconductor layer,
the third electrode is a drain electrode, and
the source electrode and the drain electrode are on at least one of the first semiconductor layer and the second semiconductor layer.

36. A high electron mobility transistor comprising:
a first semiconductor layer;
a second semiconductor layer on the first semiconductor layer;
a first electrode, a second electrode, and a third electrode spaced apart on at least one of the first semiconductor layer and the second semiconductor layer,
the second electrode being on a reverse diode structure, wherein
the reverse diode structure includes a first layer including a group III nitride semiconductor doped with a p-type dopant,
the first layer directly contacts the first electrode,
the reverse diode structure includes a second layer on the first layer, and
the second layer includes one of,
a group III nitride semiconductor doped with an n-type dopant,
an undoped group III nitride semiconductor, and
a group III nitride semiconductor doped with a p-type dopant at a concentration lower than a p-type dopant concentration in the first layer.

37. A high electron mobility transistor comprising:
a first semiconductor layer;
a second semiconductor layer on the first semiconductor layer;
a first electrode, a second electrode, and a third electrode spaced apart on at least one of the first semiconductor layer and the second semiconductor layer,
the second electrode being on one of a depletion structure and a reverse diode structure,
wherein, if the one of the depletion structure and the reverse diode structure is the depletion structure,
an insulating layer is not between opposing surfaces of the second electrode and the depletion structure, and
the depletion structure is spaced part from the third electrode,
wherein an upper surface of the second semiconductor layer defines a recess.

38. The high electron mobility transistor of claim 37, wherein the second electrode is on the recess defined by the upper surface of the second semiconductor layer.

* * * * *